(12) United States Patent
Polizzi et al.

(10) Patent No.: US 6,509,768 B2
(45) Date of Patent: Jan. 21, 2003

(54) LOW-CONSUMPTION POWER-ON RESET CIRCUIT FOR SEMICONDUCTOR MEMORIES

(75) Inventors: Salvatore Polizzi, Palermo (IT); Raffaele Solimene, Sorrento (IT)

(73) Assignee: STMicroelectronics S.r.L., Agrate Brianza (IT)

( * ) Notice: Subject to any disclaimer, the term of this patent is extended or adjusted under 35 U.S.C. 154(b) by 0 days.

(21) Appl. No.: 09/770,835

(22) Filed: Jan. 25, 2001

(65) Prior Publication Data

US 2001/0019281 A1 Sep. 6, 2001

(30) Foreign Application Priority Data

Jan. 28, 2000 (IT) .......................................... TO00A0088

(51) Int. Cl.$^7$ ................................................. H03L 7/00
(52) U.S. Cl. ....................................... 327/143; 327/198
(58) Field of Search ................................. 327/143, 198

(56) References Cited

U.S. PATENT DOCUMENTS

| | | | | | |
|---|---|---|---|---|---|
| 5,684,417 A | * | 11/1997 | Huang et al. | .................. | 327/51 |
| 5,886,549 A | * | 3/1999 | Naura | ......................... | 327/143 |
| 5,889,664 A | * | 3/1999 | Oh | .............................. | 363/60 |
| 6,147,529 A | * | 11/2000 | Yeh et al. | .................... | 327/143 |

* cited by examiner

Primary Examiner—Terry D. Cunningham
Assistant Examiner—Quan Tra
(74) Attorney, Agent, or Firm—Lisa K. Jorgenson; E. Russell Tarleton; SEED IP LAw Group

(57) ABSTRACT

A power-on reset circuit connected to a supply line feeding a supply voltage, the circuit including an output terminal supplying a power-on reset signal; a divider connected between the supply line (36) and ground and having an intermediate node supplying a division voltage correlated to the supply voltage; an inverter having an input connected to the intermediate node and an output connected to the output terminal and supplying a reset logic signal; and a deactivation branch coupled to the supply line and the intermediate node. The deactivation branch preventing switching of the power-on reset signal on the output terminal when the supply voltage is higher than a deactivation voltage.

13 Claims, 4 Drawing Sheets

LOW-CONSUMPTION POWER-ON RESET CIRCUIT FOR SEMICONDUCTOR MEMORIES

TECHNICAL FIELD

The present invention relates to a low-consumption power-on reset circuit for semiconductor memories.

BACKGROUND OF THE INVENTION

As is known, in semiconductor memories, it is essential for the supply voltage to be kept stable, and in any event higher than a predetermined threshold. In fact, otherwise, errors may occur during reading and writing, and, in addition, data contained in configuration registers may be adversely affected. For this reason, semiconductor memories are normally provided with power-on reset circuits, which, if the supply voltage drops excessively, generate a power-on reset pulse (called hereinafter POR pulse), in order to inhibit the operations of reading and writing, and to re-initialize the configuration registers.

For greater clarity, reference is made to FIGS. 1 and 2, showing two examples of power-on reset circuits of a known type.

In FIG. 1, the reference number 1 indicates a power-on reset circuit of a semiconductor memory device 100, comprising a first divider 2, an inverter 3, and an output terminal 9.

The first divider 2 is connected between ground and a supply line 5 supplying a supply voltage VDD, of, for example, 6 V, and includes a first resistive branch 6 and a variable resistive network 7. The first resistive branch 6 comprises a transistor of NMOS type in diode configuration, with drain and gate terminals connected to one another. The first resistive branch 6 and the variable resistive network 7 are connected at an intermediate node 8, supplying a first division voltage $V_{PR}$ proportional to the supply voltage $V_{DD}$, according to the division ratio of the divider 2. The variable resistive network 7 comprises a second resistive branch 7a, formed by a plurality of resistive transistors 4 arranged in series and having respective gate terminals connected to the supply line 5, and by a connectable transistor 7b of NMOS type, arranged in parallel with the second resistive branch 7a and having a gate terminal connected to the output terminal 9.

The inverter 3, normally of CMOS type having trip voltage, receives at the input the first division voltage $V_{PR}$, has an output connected to the output terminal 9, and supplies a reset signal POR.

In normal functioning conditions, i.e., when the supply voltage $V_{DD}$ is higher than a first threshold, the first division voltage $V_{PR}$ is higher than the trip voltage of the inverter 3, and thus the reset signal POR is set to a low logic level, such that memory reading and writing are enabled. In addition, the connectable transistor 7b is off.

During transitory, e.g., when the memory device is switched on, or in presence of noise, if the supply voltage $V_{DD}$ is below a first threshold, the first division voltage $V_{PR}$ is lower than the trip voltage of the inverter 3. Consequently, the reset signal POR switches to a high logic level, thus inhibiting reading and writing of the memory, and reinitialization of the configuration registers. In addition, the connectable transistor 7a is on, and thus the resistance value of the variable resistive network 7 is varied, together with the division ratio of the divider 2, and consequently the value of the first division voltage $V_{PR}$.

As the supply voltage $V_{DD}$ increases, and exceeds a second threshold, greater than the first threshold, and causes further switching of the inverter 3, the reset signal POR goes to the low logic level, and reading and writing are enabled once more.

According to a different solution, shown in FIG. 2, the power-on reset circuit 1 comprises an enabling stage 11, formed by the same components of the power-on reset circuit 1 of FIG. 1 (and therefore indicated by the same reference numbers), and a generation stage 12.

The generation stage 12 comprises a second divider 15 and a comparator 18. The second divider 15 has a first terminal connected to ground and a second terminal connected to the supply line 5, via a switch 16. The comparator 18 has a first input connected to a second intermediate node 19 of the second divider 15, a second input which receives a constant reference voltage $V_{REF}$, and an output, which defines an output terminal 20 of the power-on reset circuit 1, and supplies the reset signal POR. In addition, the switch 16 has a control terminal connected to the output terminal 9 of the enabling stage 11, which selectively enables and deactivates the generation stage 12, and thus the switching of the reset signal POR. In particular, when the signal at the output terminal 9 of the enabling stage 11 is at the low logic level (i.e., the supply voltage $V_{DD}$ is higher than the first threshold, and close to the nominal value), the switch 16 is open and the generation stage 12 is deactivated. In particular, in this phase, the reset signal POR is at the low logic level, such as to allow reading and writing. If, on the other hand, the supply voltage $V_{DD}$ drops below the first threshold, the signal at the output terminal 9 of the enabling stage 11 causes the switch 16 to close, thus enabling the generation stage 12. In this situation, the reset signal POR is at the low logic level, if the voltage at the second intermediate node 19 (which is proportional to the supply voltage $V_{DD}$ according to the ratio of division of the second divider 15) is greater than the reference voltage $V_{REF}$, otherwise it is at the high logic level, such as to inhibit reading and writing, and to re-initialize the registers.

The known devices have some disadvantages, mainly due to the operating conditions of the inverter 3 and of the first divider 2. In fact, during normal functioning, i.e., when the supply voltage $V_{DD}$ is close to its nominal value, the division voltage $V_{PR}$ at the first intermediate node 8 is at a lower value than the supply voltage $V_{DD}$, according to the ratio of division between the first resistive branch 6 and the variable resistive network 7. Consequently, the inverter 3 is conducting, and thus power is absorbed even when the inverter 3 does not switch, thus increasing the consumption of the memory device 100. In addition, the conductivity of the divider 2, and consequently the absorbed current, depend on the value of the supply voltage $V_{DD}$, and are maximal in nominal functioning conditions.

SUMMARY OF THE INVENTION

The object of the present invention is to provide a power-on reset circuit which is free from the disadvantages described, and in particular has reduced consumption.

According to the present invention, a power-on circuit for semiconductor memories is provided, the circuit including a supply line set to a supply voltage; an output terminal supplying a reset logic signal; a divider connected between the supply line and a reference power line and having an intermediate node that supplies a division voltage correlated to the supply voltage and connected to the output terminal; and deactivation circuitry coupled to the supply line and the intermediate node, the deactivation circuitry being active and preventing switching of the reset logic signal when the supply voltage is higher than a deactivation voltage. Ideally, the deactivation circuit is inactive when the supply voltage is lower than the deactivation voltage.

In accordance with another aspect of the present invention, a power-on reset circuit is provided that includes a supply line set to a supply voltage; a supply circuit coupled to the supply line and configured to generate a division voltage at an intermediate node; an inverter connected between the intermediate node and an output terminal and configured to output a power-on reset signal when the supply voltage is less than a threshold value; and a deactivation circuit coupled to the supply line and the intermediate node, the deactivation circuit configured to prevent output of the power-on reset signal to maintain the division voltage at a voltage that is approximately the value of the supply voltage such that the inverter does not absorb current when the supply voltage is above the threshold value. Ideally, the supply circuit is configured to absorb little current when the supply voltage is above the threshold value.

In accordance with a further aspect of the present invention, a power-on reset circuit is disclosed that includes a voltage divider circuit coupled between a ground potential and a supply line that supplies a supply voltage, the voltage divider circuit configured to output a division voltage at an intermediate node;

an inverter coupled between the intermediate node and an output terminal and configured to output a power-on reset signal when the supply voltage is below a first threshold value; and a deactivation circuit coupled to the supply line and to the intermediate node, the deactivation circuit configured to prevent output of the power-on reset signal and to maintain the division voltage at approximately the supply voltage level when the supply voltage is above a second threshold voltage.

BRIEF DESCRIPTION OF THE DRAWINGS

In order to assist understanding of the invention, some embodiments are now described, purely by way of non-limiting example, and with reference to the attached drawings, wherein.

DETAILED DESCRIPTION OF THE INVENTION

Figure 1:
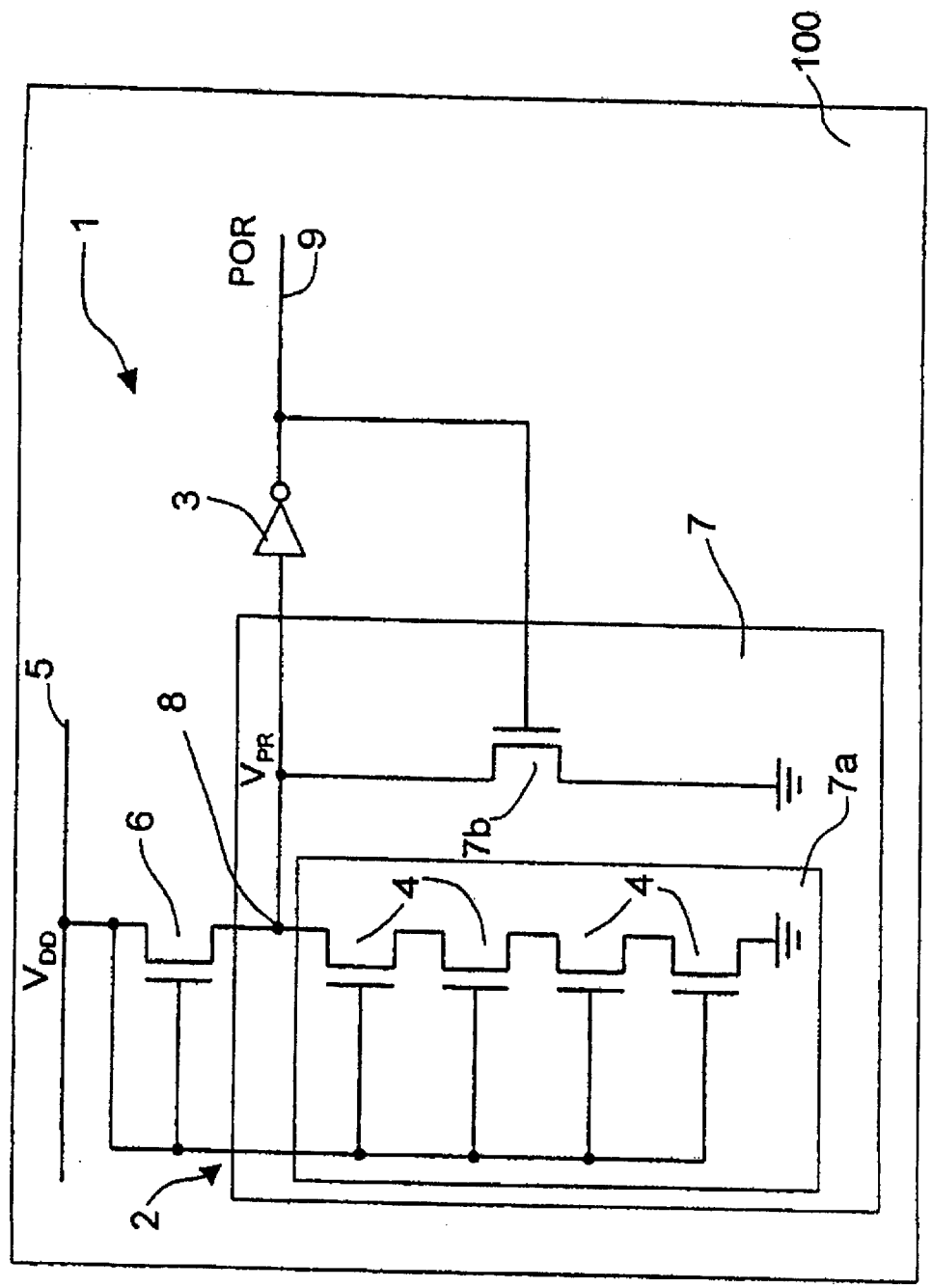
FIG. 1 illustrates a simplified circuit diagram of a first power-on reset circuit of a known type.
Figure 2:
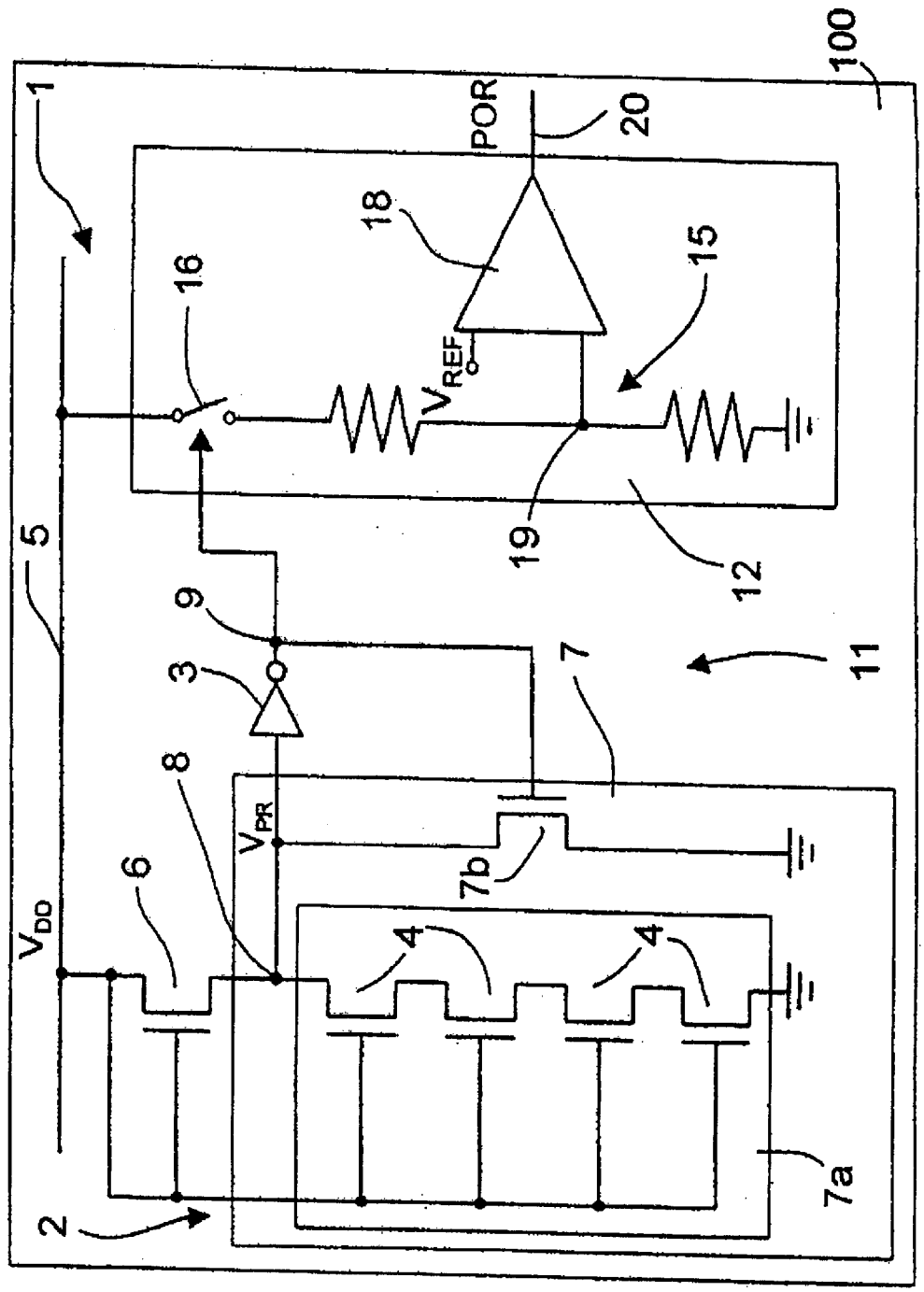
FIG. 2 illustrates a simplified circuit diagram of a second power-on reset circuit of a known type.
Figure 3:
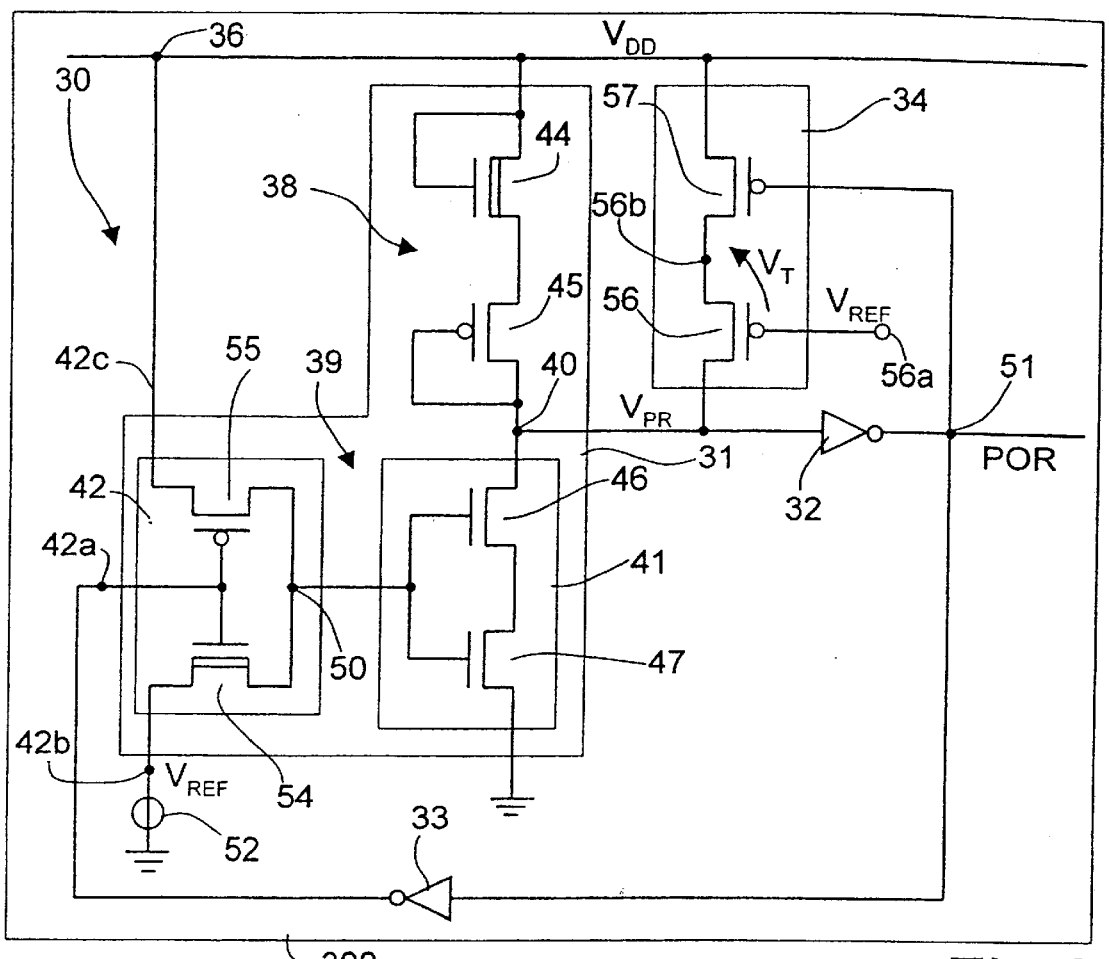
FIG. 3 illustrates a simplified circuit diagram of a first embodiment of the power-on reset circuit according to the present invention.

As shown in FIG. 3, a power-on reset circuit 30, which belongs to a nonvolatile semiconductor memory device 300, of a known type and not shown in detail, comprises a divider 31, a first and a second inverter 32, 33, a deactivation branch 34, and an output terminal 51.

The divider 31 has a variable division ratio, is connected between ground and a supply line 36 that supplies a supply voltage $V_{DD}$ (for example of 6 V), and includes a first resistive branch 38 and a variable resistive network 39, connected to one another at an intermediate node 40. The intermediate node 40 supplies a division voltage $V_{PR}$ proportional to the supply voltage $V_{DD}$, according to the division ratio of the divider 31.

The first resistive branch 38 comprises a first resistive transistor 44, of natural (low threshold) NMOS type in diode configuration, with drain and gate terminals connected to the supply line 36; and a second resistive transistor 45, of the PMOS type in diode configuration, with drain and gate terminals connected to the intermediate node 40. In addition, the source terminals of the resistive transistors 44, 45 are connected to one another.

The variable resistive network 39 includes a second resistive branch 41 and a selector 42.

The second resistive branch 41 comprises at least a third and a fourth resistive transistor 46, 47 of NMOS type, and has a biasing terminal 50. In detail, the third resistive transistor 46 has a drain terminal connected to the intermediate node 40, and a source terminal connected to the drain terminal of the fourth resistive transistor 47, which has a source terminal connected to ground. In addition, the gate terminals of the resistive transistors 46, 47 are connected to the biasing terminal 50.

The selector 42 has a control terminal 42a connected to the output terminal 51, via the second inverter 33, a first input 42b connected to a voltage source 52, a second input 42c connected to the supply line 36, and an output connected to the biasing terminal 50 of the second resistive branch 41. In greater detail, the selector 42 comprises a first selection transistor 54 of natural NMOS type, with a drain terminal connected to the voltage source 52, and a source terminal connected to the biasing terminal 50, and a second selection transistor 55, of PMOS type, with a source terminal connected to the supply line 36 and a drain terminal connected to the biasing terminal 50. The gate terminals of the selection transistors 54, 55 are connected to the control terminal 42a of the selector 42.

The voltage source 52 supplies a reference voltage $V_{REF}$, which is constant and independent from the supply voltage $V_{DD}$. Preferably, the voltage source is of band-gap type, and supplies a voltage of 1.27 V.

The first inverter 32, of CMOS type and with a trip voltage, has an input connected to the intermediate node 40 of the divider 31, and an output connected to the output terminal 51 of the power-on reset circuit 30, and supplying a reset logic signal POR.

The deactivation branch 34 comprises a first and a second deactivation transistor 56, 57, both of PMOS type. The first deactivation transistor 56, which has a threshold voltage $V_T$, has a drain terminal connected to the intermediate node 40 of the divider 31, a gate terminal 56a connected to the voltage source 52, and a source terminal 56b connected to the drain terminal of the second deactivation transistor 57. The second deactivation transistor 57 has a gate terminal connected to the output terminal 51 of the power-on reset circuit 30, and a source terminal connected to the supply line 36.

The power-on reset circuit 30 operates as follows (reference is also made to FIG. 4, which shows the plot of the supply voltage $V_{DD}$, shown by a continuous line, and of the reset logic signal $V_{DD}$, shown by a broken line), in case of a decrease in the supply voltage $V_{DD}$.

In normal operation conditions, when the supply voltage $V_{DD}$ is substantially at its own nominal value, the first and the second deactivation transistors 56, 57 are both conducting, and keep the division voltage $V_{PR}$ at the intermediate node 40 close to the supply voltage $V_{DD}$, such as to prevent absorption of current by the first inverter 32. In this phase, switching is inhibited of the reset logic signal POR, which remains at a low logic level, and reading and writing of the memory 300 are enabled.

In addition, the reset logic signal POR controls the selector 42, such as to connect the biasing terminal 50 of the variable resistive network 39 to the voltage source 52. In fact, the second inverter 33 has a high logic level at the control terminal 42a, which keeps the first selection transistor 54 on, and keeps the second selection transistor 55 off. Thus, the gate terminals of the third and fourth resistive transistors 46, 47 receive the reference voltage $V_{REF}$ via the biasing terminal 50. Thereby, a first resistance value of the variable resistive network 39 is set, which is high, since the reference voltage $V_{REF}$ has a value such that the source-gate voltage of the third resistive transistor 46 is slightly higher than its threshold voltage. The divider 31 thus absorbs a very low current, which is independent from the supply voltage $V_{DD}$.

If the supply voltage $V_{DD}$ drops below a deactivation voltage $V_{AB}$, given by the sum of the reference voltage $V_{REF}$ and the absolute value of the threshold voltage $V_T$ of the first deactivation transistor 56 (FIG. 4), the latter switches off, thus interrupting the deactivation branch 34. Consequently the division voltage $V_{PR}$ is no longer kept close to the supply voltage $V_{DD}$, but goes to a value determined by the division ratio of the divider 31. In this phase, switching of the reset logic signal POR is thus enabled.

Figure 4:
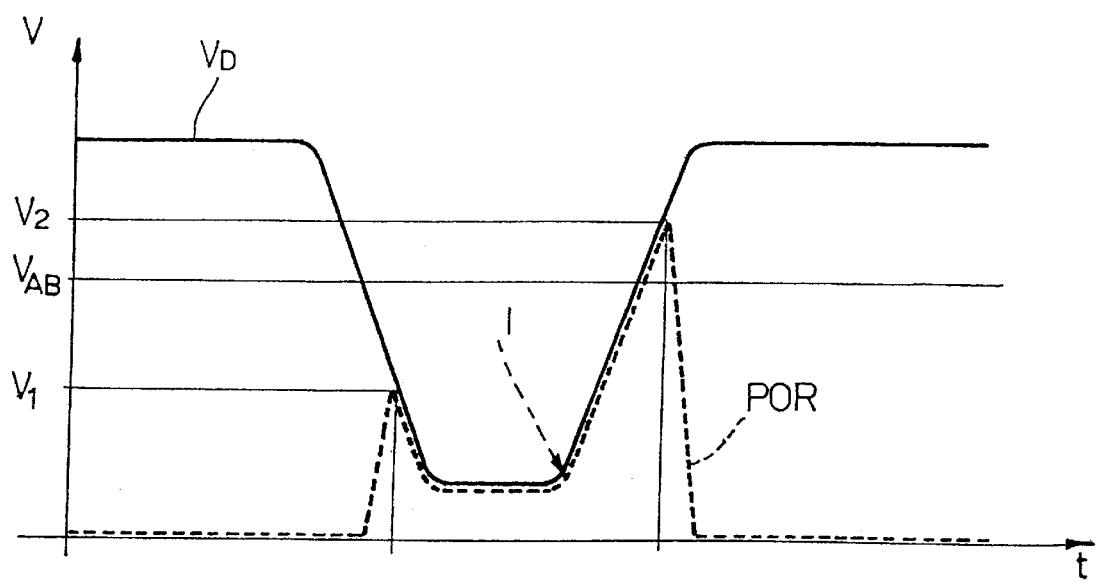
FIG. 4 shows temporal plots of voltages present in the power-on reset circuit in FIG. 3.

In particular, if the supply voltage $V_{DD}$ decreases further, and drops below a first threshold $V_1$ (FIG. 4), the division voltage $V_{PR}$ becomes lower than the trip voltage of the first inverter 32. The reset logic signal POR thus goes to a high logic level (equal to the supply voltage $V_{DD}$), and a reset pulse I starts (FIG. 4). In this situation, reading and writing of the memory 300 are prevented, and the configuration registers (not shown) are initialized. In addition, the second deactivation transistor 57 switches off, and the control terminal 42a of the selector 42 receives a low logic level. Consequently, since the second selection transistor 55 switches on, whereas the first selection transistor 54 switches off, the selector 42 is controlled such as to supply the supply voltage $V_{DD}$ to the biasing terminal 50 of the variable resistive network 39. Thus, a second resistance value of the variable resistive network 39 is set, which is lower than the first resistance value, and the division ratio of the divider 31 is modified.

When the supply voltage $V_{DD}$ increases once more and exceeds a second threshold $V_2$ (FIG. 4), higher than the first threshold $V_1$ and higher than the deactivation threshold, the division voltage $V_{PR}$ exceeds the trip voltage of the first inverter 32, the reset logic signal POR returns to the low logic level, and the reset pulse I ends. In this case, the first and the second deactivation transistors 56, 57 switch on again, switching of the POR reset logic signal is inhibited, and the power-on reset circuit 30 returns to the normal operative state.

The same operation of the power-on reset circuit 30 as above described occurs when the memory device 300 is switched on.

Figure 5:
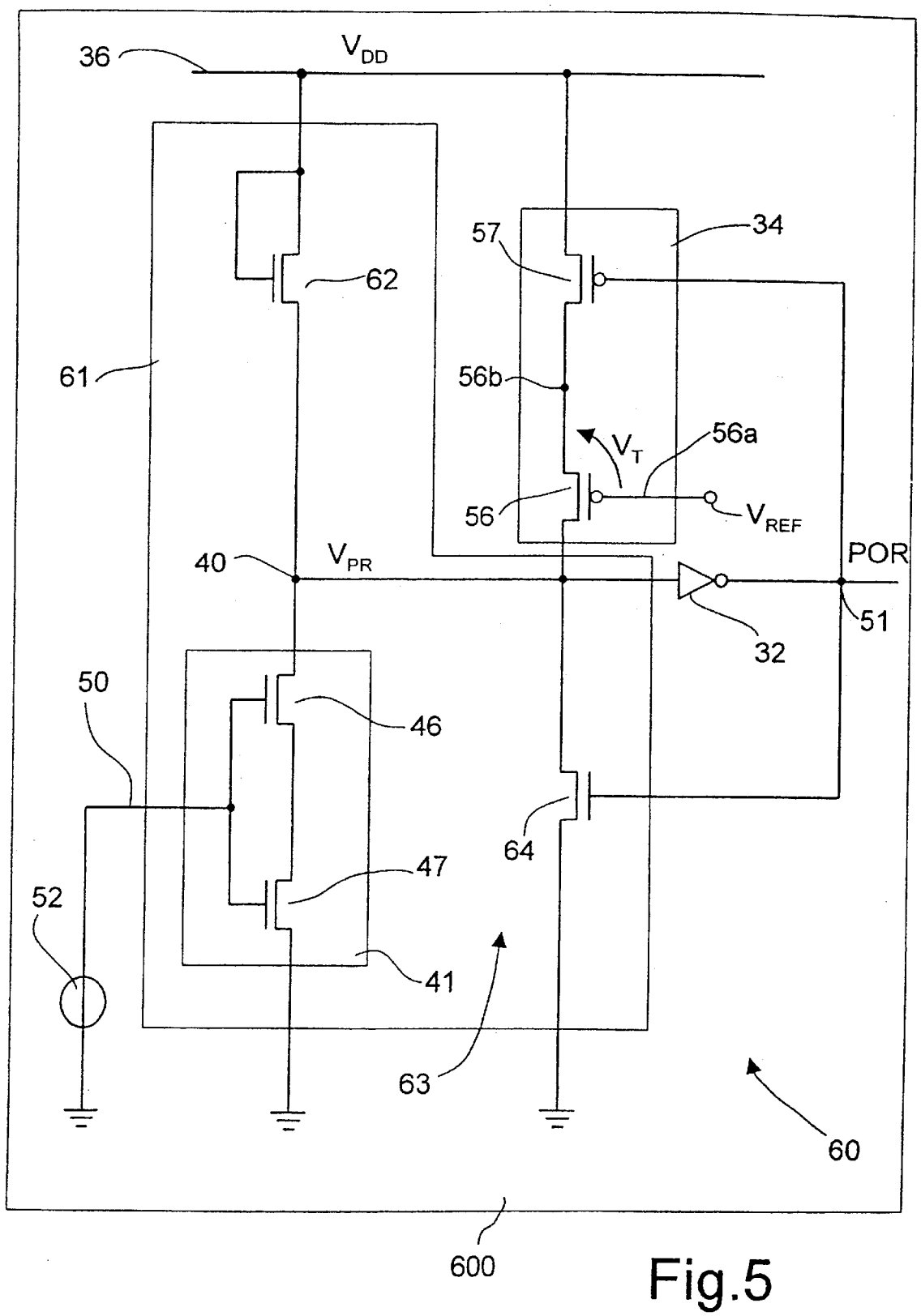
FIG. 5 illustrates a simplified circuit diagram of a second embodiment of the power-on reset circuit according to the present invention.

According to a different embodiment of the invention, shown in FIG. 5, in which parts common to the embodiment of FIG. 3 are indicated by the same reference numbers, a power-on reset circuit 60 of a memory device 600 comprises a divider 61, the first inverter 32, the deactivation branch 34 formed by the first and second deactivation transistors 56, 57, and the output terminal 51.

The divider 61 consists of a first resistive branch 62 and a variable resistive network 63.

The first resistive branch 62 comprises a transistor of NMOS type, which has gate and drain terminals connected to one another, and disposed between the supply line 36, which supplies the supply voltage $V_{DD}$, and the intermediate node 40.

The variable resistive network 63, connected between the intermediate node 40 and ground, comprises the second resistive branch 41 which is present in the variable resistive network 39 in FIG. 3, and also a connectable transistor 64 of NMOS type, which has a gate terminal connected to the output terminal 51 of the power-on reset circuit 60, and forms a connectable resistive branch, arranged in parallel with the second resistive branch 41. In addition, the biasing terminal 50 of the second resistive branch 41 is connected directly to the voltage source 52, from which it receives the reference voltage $V_{REF}$.

In normal operation conditions, when the supply voltage $V_{DD}$ is substantially at the nominal value, the first and second deactivation transistors 56, 57 of the deactivation branch 34 are conducting. Consequently, the division voltage $V_{PR}$ at the intermediate node 40 is close to the supply voltage $V_{DD}$, the reset logic signal POR is kept at the low logic level, and its switching is inhibited. In addition, the connectable transistor 64 is off, such that the resistance value of the variable resistive network 63 is determined by the second resistive branch 41 alone.

When the supply voltage $V_{DD}$ drops below the deactivation voltage $V_{AB}$, given by the sum of the reference voltage $V_{REF}$ and the threshold voltage $V_T$ of the first deactivation transistor 56 (FIG. 4), the latter switches off and interrupts the deactivation branch 34. Consequently, the switching of the reset logic signal POR is enabled, and the division voltage $V_{PR}$ goes to a value which is determined by the division ratio of the divider 61.

In particular, if the supply voltage $V_{DD}$ drops below the first threshold $V_1$ (FIG. 4), and thus the division voltage $V_{PR}$ is lower than the trip voltage of the first inverter 32, the reset logic signal POR goes to the high logic level (equal to the supply voltage $V_{DD}$) and a reset pulse I begins. Then, the second deactivation transistor 57 switches off, whereas the connectable transistor 64 starts to conduct, and the resistance of the variable resistive network 63 decreases.

When the supply voltage $V_{DD}$ starts to increase once more, and exceeds the second threshold $V_2$, the division voltage $V_{PR}$ at the intermediate node 40 becomes higher than the trip voltage of the first inverter 32. The reset logic signal POR therefore switches to the low logic level, the rest pulse I ends, and the power-on reset circuit 60 goes to the normal operation.

The power-on reset circuit described has reduced consumption because in normal operation the deactivation branch 34 keeps the division voltage $V_{PR}$ at the intermediate node 40 at a value close to that of the supply voltage $V_{DD}$, such that the first inverter 32 does not absorb current. In addition, in normal operation, the divider 31, 61 absorbs a very low current, since its resistance is independent from the supply voltage $V_{DD}$, and in particular it is kept at a high value because the biasing terminal 50 of the second resistive branch 41 is biased to the reference voltage $V_{REF}$.

The described consumption is particularly important, since the power-on reset circuit is in the normal operative conditions for almost all the time, whereas transitory conditions with an excessively low supply voltage occur only during switching on, or for very brief intervals of time.

Finally, it is apparent that modifications and variants can be made to the circuit described, without departing from the scope of the present invention. Hence, the invention is to be limited only by the appended claims and the equivalents thereof.

What is claimed is:

1. A power-on reset circuit for a semiconductor memory, comprising:

a supply line set to a supply voltage;

an output terminal supplying a reset logic signal;

a divider connected between the supply line and a reference potential and having an intermediate node that supplies a division voltage correlated to the supply voltage and connected to the output terminal; and deactivation means coupled to the supply line and to the intermediate node, the deactivation means being active and preventing switching of the reset logic signal when the supply voltage is higher than a deactivation voltage, and being inactive when the supply voltage is lower than the deactivation voltage, the deactivation means comprising a first deactivation transistor having a first terminal connected to the intermediate node, a second terminal connected to the supply line, and a third terminal connected to a voltage source means, a second deactivation transistor connected between the supply line and the first deactivation transistor, and having a gate terminal connected to the output terminal, the second deactivation transistor configured to be on when the reset logic signal is at a first logic level and to be off when the reset logic signal is at a second logic level.

2. A power-on reset circuit for a semiconductor memory, comprising:

a supply line set to a supply voltage;

an output terminal supplying a reset logic signal;

a divider connected between the supply line and a reference potential line and having an intermediate node that supplies a division voltage correlated to the supply voltage and connected to the output terminal, the divider comprising a first resistive branch connected between the supply line and the intermediate node, and a variable resistive network connected between the intermediate node and the reference potential line, the variable resistive network having a selectable resistance; and deactivation means coupled to the supply line and the intermediate node, the deactivation means configured to be active and preventing switching of the reset logic signal when the supply voltage is higher than a deactivation voltage and being active when the supply voltage is lower than the deactivation voltage.

3. A power-on reset circuit for a semiconductor memory, comprising:

a supply line set to a supply voltage;

an output terminal supplying a reset logic signal;

a divider connected between the supply line and a reference potential line and having an intermediate node that supplies a division voltage correlated to the supply voltage and connected to the output terminal, the divider comprising a first resistive branch connected between the supply line and the intermediate node, and a variable resistive network connected between the intermediate node and the reference potential line, the variable resistive network having a selectable resistance;

deactivation means coupled to the supply line and the intermediate node, the deactivation means configured to be active and preventing switching of the reset logic signal when the supply voltage is higher than a deactivation voltage and being active when the supply voltage is lower than the deactivation voltage; and a voltage source means supplying a reference voltage independent from the supply voltage, and wherein the variable resistive network comprises a second resistive branch having a biasing terminal connected to the voltage source means, the referenced voltage having a value close to a threshold voltage of the second resistive branch.

4. A power-on reset circuit for a semiconductor memory, comprising:

a supply line set to a supply voltage;

an output terminal supplying a reset logic signal;

a divider connected between the supply line and a reference potential line and having an intermediate node that supplies a division voltage correlated to the supply voltage and connected to the output terminal, the divider comprising a first resistive branch connected between the supply line and the intermediate node, and a variable resistive network connected between the intermediate node and the reference potential line, the variable resistive network having a selectable resistance;

deactivation means coupled to the supply line and the intermediate node, the deactivation means configured to be active and preventing switching of the reset logic signal when the supply voltage is higher than a deactivation voltage and being active when the supply voltage is lower than the deactivation voltage; and a voltage source means supplying a reference voltage independent from the supply voltage, and wherein the variable resistive network comprises a second resistive branch having a biasing terminal connected to the voltage source means, the referenced voltage having a value close to a threshold voltage of the second resistive branch, the second resistive branch comprising at least a first and a second resistive transistor having respective gate terminals connected to the biasing terminal.

5. A power-on reset circuit for a semiconductor memory, comprising:

a supply line set to a supply voltage;

an output terminal supplying a reset logic signal;

a divider connected between the supply line and a reference potential line and having an intermediate node that supplies a division voltage correlated to the supply voltage and connected to the output terminal, the divider comprising a first resistive branch connected between the supply line and the intermediate node, and a variable resistive network connected between the intermediate node and the reference potential line, the variable resistive network having a selectable resistance;

deactivation means coupled to the supply line and the intermediate node, the deactivation means configured to be active and preventing switching of the reset logic signal when the supply voltage is higher than a deactivation voltage and being active when the supply voltage is lower than the deactivation voltage; and a voltage source means supplying a reference voltage independent from the supply voltage, and wherein the variable resistive network comprises a second resistive branch having a biasing terminal connected to the voltage source means, the referenced voltage having a value close to a threshold voltage of the second resistive branch, the second resistive branch comprising at least a first and a second resistive transistor having respective gate terminals connected to the biasing terminal, wherein the variable resistive network further comprises selector means having a control terminal connected to the output terminal, a first input connected to the voltage source means, a second input connected to the supply line, and an output connected to the biasing terminal; the output of the selector means connected selectively to the first input when the reset logic signal is a first logic level and to the second input when the reset logic signal is at a second logic level.

6. A power-on reset circuit for a semiconductor memory, comprising:

a supply line set to a supply voltage;

an output terminal supplying a reset logic signal;

a divider connected between the supply line and a reference potential line and having an intermediate node that supplies a division voltage correlated to the supply voltage and connected to the output terminal, the divider comprising a first resistive branch connected between the supply line and the intermediate node, and a variable resistive network connected between the intermediate node and the reference potential line, the variable resistive network having a selectable resistance;

deactivation means coupled to the supply line and the intermediate node, the deactivation means configured to be active and preventing switching of the reset logic signal when the supply voltage is higher than a deactivation voltage and being active when the supply voltage is lower than the deactivation voltage; and a voltage source means supplying a reference voltage independent from the supply voltage, and wherein the variable resistive network comprises a second resistive branch having a biasing terminal connected to the voltage source means, the referenced voltage having a value close to a threshold voltage of the second resistive branch, the second resistive branch comprising at least a first and a second resistive transistor having respective gate terminals connected to the biasing terminal, wherein the variable resistive network further comprises selector means having a control terminal connected to the output terminal, a first input connected to the voltage source means, a second input connected to the supply line, and an output connected to the biasing terminal, the variable resistive network comprising a connectable resistive branch arranged in parallel with the second resistive branch, the connectable resistive branch being disconnected when the reset logic signal is a first logic level and being connected when the reset logic signal is at a second logic level.

7. A power-on reset circuit for a semiconductor memory, comprising:

a supply line set to a supply voltage;

an output terminal supplying a reset logic signal;

a divider connected between the supply line and a reference potential line and having an intermediate node that supplies a division voltage correlated to the supply voltage and connected to the output terminal, the divider comprising a first resistive branch connected between the supply line and the intermediate node, and a variable resistive network connected between the intermediate node and the reference potential line, the variable resistive network having a selectable resistance;

deactivation means coupled to the supply line and the intermediate node, the deactivation means configured to be active and preventing switching of the reset logic signal when the supply voltage is higher than a deactivation voltage and being active when the supply voltage is lower than the deactivation voltage; and a voltage source means supplying a reference voltage independent from the supply voltage, and wherein the variable resistive network comprises a second resistive branch having a biasing terminal connected to the voltage source means, the referenced voltage having a value close to a threshold voltage of the second resistive branch, the second resistive branch comprising at least a first and a second resistive transistor having respective gate terminals connected to the biasing terminal, wherein the variable resistive network further comprises selector means having a control terminal connected to the output terminal, a first input connected to the voltage source means, a second input connected to the supply line, and an output connected to the biasing terminal, the variable resistive network comprising a connectable resistive branch arranged in parallel with the second resistive branch, the connectable resistive branch being disconnected when the reset logic signal is a first logic level and being connected when the reset logic signal is at a second logic level, wherein the connectable resistive branch comprises a MOS transistor having a gate terminal connected to the output terminal.

8. A power-on reset circuit for a semiconductor memory, comprising:

a supply line set to a supply voltage;

an output terminal supplying a reset logic signal;

a divider connected between the supply line and a reference potential line and having an intermediate node that supplies a division voltage correlated to the supply voltage and connected to the output terminal, the divider comprising a first resistive branch connected between the supply line and the intermediate node, and a variable resistive network connected between the intermediate node and the reference potential line, the variable resistive network having a selectable resistance;

deactivation means coupled to the supply line and the intermediate node, the deactivation means configured to be active and preventing switching of the reset logic signal when the supply voltage is higher than a deactivation voltage and being active when the supply voltage is lower than the deactivation voltage; and a voltage source means supplying a reference voltage independent from the supply voltage, and wherein the variable resistive network comprises a second resistive branch having a biasing terminal connected to the voltage source means, the referenced voltage having a value close to a threshold voltage of the second resistive branch, the voltage source means comprising a band-gap source.

9. A power-on reset circuit, comprising:

a voltage divider circuit coupled between a ground potential and a supply line supplying a supply voltage, the voltage divider circuit configured to output a division voltage at an intermediate node;

an inverter coupled between the intermediate node and an output terminal, the inverter configured to output a power-on reset signal when the supply voltage is below a first threshold value; and a deactivation circuit coupled to the supply line and to the inverter, the deactivation circuit configured to prevent output of the power-on reset signal and to maintain the division voltage at approximately the supply voltage when the supply voltage is above a second threshold voltage, the deactivation circuit comprising first and second transistors connected in series to each other, the first transistor connected between the supply line and the second transistor and having a gate terminal connected to the output terminal, the second transistor connected between the first transistor and the intermediate node and having a gate terminal connected to a reference voltage source.

10. A power-on reset circuit, comprising:

a supply line set to a supply voltage;

a supply circuit coupled to the supply line and configured to generate a division voltage at an intermediate node;

an inverter connected between the intermediate node and an output terminal and configured to output a power-on reset signal when the supply voltage is less than a threshold value; and a deactivation circuit coupled to the supply line and the intermediate node, the deactivation circuit configured to prevent output of the power-on reset signal, and to maintain the division voltage at a value that is approximately the value of the supply voltage such that the inverter does not absorb current when the supply voltage is above the threshold value, a first deactivation transistor connected in series with a second deactivation transistor, the first deactivation transistor having a first terminal connected to the supply line and a second terminal connected to the second deactivation transistor, and a gate terminal connected to the output terminal, the second deactivation transistor having a first terminal coupled to the second terminal of the first deactivation transistor, a second terminal coupled to the intermediate node, and a gate terminal coupled to a ground terminal.

11. A power-on reset circuit, comprising:

a supply line set to a supply voltage;

a supply circuit coupled to the supply line and configured to generate a division voltage at an intermediate node;

an inverter connected between the intermediate node and an output terminal and configured to output a power-on reset signal when the supply voltage is less than a threshold value; and a deactivation circuit coupled to the supply line and the intermediate node, the deactivation circuit configured to prevent output of the power-on reset signal, and to maintain the division voltage at a value that is approximately the value of the supply voltage such that the inverter does not absorb current when the supply voltage is above the threshold value, a first deactivation transistor connected in series with a second deactivation transistor, the first deactivation transistor having a first terminal connected to the supply line and a second terminal connected to the second deactivation transistor, and a gate terminal connected to the output terminal, the second deactivation transistor having a first terminal coupled to the second terminal of the first deactivation transistor, a second terminal coupled to the intermediate node, and a gate terminal coupled to a ground terminal, wherein the supply circuit comprises a voltage divider having a first resistive branch connected between the supply line and the intermediate node, and a variable resistive network coupled between the intermediate node and a reference potential line, the variable resistive network having a selectable resistance.

12. A power-on reset circuit, comprising:

a supply line set to a supply voltage;

a supply circuit coupled to the supply line and configured to generate a division voltage at an intermediate node;

an inverter connected between the intermediate node and an output terminal and configured to output a power-on reset signal when the supply voltage is less than a threshold value; and a deactivation circuit coupled to the supply line and the intermediate node, the deactivation circuit configured to prevent output of the power-on reset signal, and to maintain the division voltage at a value that is approximately the value of the supply voltage such that the inverter does not absorb current when the supply voltage is above the threshold value, a first deactivation transistor connected in series with a second deactivation transistor, the first deactivation transistor having a first terminal connected to the supply line and a second terminal connected to the second deactivation transistor, and a gate terminal connected to the output terminal, the second deactivation transistor having a first terminal coupled to the second terminal of the first deactivation transistor, a second terminal coupled to the intermediate node, and a gate terminal coupled to a ground terminal, wherein the supply circuit comprises a voltage divider having a first resistive branch connected between the supply line and the intermediate node, and a variable resistive network coupled between the intermediate node and a reference potential line, the variable resistive network having a selectable resistance, the variable resistive network comprising a second resistive branch having a biasing terminal connected to the reference potential line, the reference potential line having a reference voltage with a value approximately the value of a threshold voltage of the second resistive branch.

13. A power-on reset circuit, comprising:

a supply line set to a supply voltage;

a supply circuit coupled to the supply line and configured to generate a division voltage at an intermediate node;

an inverter connected between the intermediate node and an output terminal and configured to output a power-on reset signal when the supply voltage is less than a threshold value; and a deactivation circuit coupled to the supply line and the intermediate node, the deactivation circuit configured to prevent output of the power-on reset signal, and to maintain the division voltage at a value that is approximately the value of the supply voltage such that the inverter does not absorb current when the supply voltage is above the threshold value, a first deactivation transistor connected in series with a second deactivation transistor, the first deactivation transistor having a first terminal connected to the supply line and a second terminal connected to the second deactivation transistor, and a gate terminal connected to the output terminal, the second deactivation transistor having a first terminal coupled to the second terminal of the first deactivation transistor, a second terminal coupled to the intermediate node, and a gate terminal coupled to a ground terminal, wherein the supply circuit comprises a voltage divider having a first resistive branch connected between the supply line and the intermediate node, and a variable resistive network coupled between the intermediate node and a reference potential line, the variable resistive network having a selectable resistance, the variable resistive network comprising a second resistive branch having a biasing terminal connected to the reference potential line, the reference potential line having a reference voltage with a value approximately the value of a threshold voltage of the second resistive branch, the variable resistive network comprises a selector circuit having a control terminal connected to the output terminal, a first input connected to the reference potential line, a second input connected to the supply line, and an output connected to the biasing terminal, the output of the selector means connected selectively to the first input when the power-on reset signal is at a first logic level and to the second input when the power-on reset signal is at a second logic level.

* * * * *